United States Patent [19]
Lane et al.

[11] Patent Number: 6,107,825
[45] Date of Patent: Aug. 22, 2000

[54] INPUT/OUTPUT CIRCUITRY FOR PROGRAMMABLE LOGIC DEVICES

[75] Inventors: Christopher F. Lane, Campbell; Srinivas T. Reddy, Fremont; Andy L. Lee; David Edward Jefferson, both of San Jose, all of Calif.

[73] Assignee: Altera Corporation, San Jose, Calif.

[21] Appl. No.: 09/087,630

[22] Filed: May 29, 1998

Related U.S. Application Data

[60] Provisional application No. 60/062,480, Oct. 16, 1997.

[51] Int. Cl.$^7$ ................................................ H03K 19/177
[52] U.S. Cl. ................................................ 326/41; 326/39
[58] Field of Search ........................................ 326/37–41

[56] References Cited

U.S. PATENT DOCUMENTS

| | | |
|---|---|---|
| Re. 34,363 | 8/1993 | Freeman . |
| 3,473,160 | 10/1969 | Wahlstrom ............................ 340/172.5 |
| 4,609,986 | 9/1986 | Hartmann et al. ....................... 364/200 |
| 4,617,479 | 10/1986 | Hartmann et al. . |
| 4,642,487 | 2/1987 | Carter . |
| 4,677,318 | 6/1987 | Veenstra . |
| 4,713,792 | 12/1987 | Hartmann et al. ....................... 364/900 |
| 4,758,745 | 7/1988 | Elgamal et al. . |
| 4,774,421 | 9/1988 | Hartmann et al. . |
| 4,871,930 | 10/1989 | Wong et al. . |
| 4,899,067 | 2/1990 | So et al. . |
| 4,912,342 | 3/1990 | Wong et al. . |
| 5,023,606 | 6/1991 | Kaplinsky ............................. 340/825.8 |
| 5,073,729 | 12/1991 | Greene et al. . |
| 5,083,083 | 1/1992 | El-Ayat et al. ............................ 326/41 |
| 5,121,006 | 6/1992 | Pedersen . |

(List continued on next page.)

FOREIGN PATENT DOCUMENTS

| | | | |
|---|---|---|---|
| 463746 A2 | 1/1992 | European Pat. Off. ........ | G06F 15/60 |
| 630115 A2 | 12/1994 | European Pat. Off. ..... | H03K 19/177 |
| 2295738 | 6/1996 | United Kingdom ......... | H03K 19/177 |
| 2300947 | 11/1996 | United Kingdom ......... | H03K 19/177 |
| WO 95/04404 | 2/1995 | WIPO ......................... | H03K 19/177 |
| WO 95/22205 | 8/1995 | WIPO ......................... | H03K 19/177 |
| WO 95/28769 | 10/1995 | WIPO ......................... | H03K 19/177 |
| 5,122,685 | 6/1992 | Chan et al. ................................ | 326/40 |
| 5,132,571 | 7/1992 | McCollum et al. . | |
| 5,144,166 | 9/1992 | Camarota et al. . | |
| 5,208,491 | 5/1993 | Ebeling et al. . | |
| 5,218,240 | 6/1993 | Camarota et al. . | |

OTHER PUBLICATIONS

R. C. Minnick, "A Survey of Microcellular Research," Journal of the Association for Computing Machinery, vol. 14, No. 2, pp. 203–241, Apr. 1967.

S. E. Wahlstrom, "Programmable Logic Arrays—Cheaper by the Millions," Electronics, Dec. 11, 1967, pp. 90–95.

*Recent Developments in Switching Theory*, A. Mukhopadhyay, ed., Academic Press, New York, 1971, chapters VI and IX, pp. 229–254 and 369–422.

*The Programmable Gate Array Data Book*, 1988, Xilinx, Inc., San Jose, CA.

El Gamal et al., "An Architecture for Electrically Configurable Gate Arrays," IEEE Journal of Solid–State Circuits, vol. 24, No. 2, Apr. 1989, pp. 394–398.

El–Ayat et al., "A CMOS Electrically Configurable Gate Array," IEEE Journal of Solid–State Circuits, vol. 24, No. 3, Jun. 1989, pp. 752–762.

(List continued on next page.)

*Primary Examiner*—Jon Santamauro
*Assistant Examiner*—Don Phu Le
*Attorney, Agent, or Firm*—Fish & Neave; Robert R. Jackson

[57] ABSTRACT

A programmable logic device has a plurality of conductors extending around its periphery for use in providing at least some of the signals needed for control of input/output ("I/O") pins which are also disposed around the periphery of the device. These control signals may include clock signals, output enable signals, clock enable signals, clear signals, or the like. The conductors that thus extend around the periphery are segmented into plural segments that can either be used independently of one another or programmably stitched together and therefore used together.

15 Claims, 6 Drawing Sheets

U.S. PATENT DOCUMENTS

| | | | |
|---|---|---|---|
| 5,220,214 | 6/1993 | Pedersen . | |
| 5,225,719 | 7/1993 | Agrawal et al. . | |
| 5,255,203 | 10/1993 | Agrawal wt al. | 364/489 |
| 5,258,668 | 11/1993 | Cliff et al. . | |
| 5,260,610 | 11/1993 | Pedersen et al. . | |
| 5,260,611 | 11/1993 | Cliff et al. . | |
| 5,274,581 | 12/1993 | Cliff et al. | 364/784 |
| 5,338,984 | 8/1994 | Sutherland . | |
| 5,350,954 | 9/1994 | Patel . | |
| 5,371,422 | 12/1994 | Patel et al. | 326/41 |
| 5,448,186 | 9/1995 | Kawata | 326/41 |
| 5,455,525 | 10/1995 | Ho et al. | 326/41 |
| 5,457,410 | 10/1995 | Ting | 326/41 |
| 5,467,029 | 11/1995 | Taffe et al. | 326/41 |
| 5,469,003 | 11/1995 | Kean | 326/39 |
| 5,483,178 | 1/1996 | Costello et al. | 326/41 |
| 5,509,128 | 4/1996 | Chan | 395/311 |
| 5,541,530 | 7/1996 | Cliff et al. | 326/41 |
| 5,689,195 | 11/1997 | Cliff et al. | 326/41 |
| 5,705,939 | 1/1998 | McClintock et al. | 326/41 |
| 5,742,179 | 4/1998 | Sasaki | 326/41 |
| 5,764,080 | 6/1998 | Huang et al. | 326/41 |
| 5,796,267 | 8/1998 | Pedersen | 326/39 |
| 5,942,913 | 8/1999 | Young et al. | 326/41 |

OTHER PUBLICATIONS

*ACT Family Field Programmable Gate Array Databook*, Apr. 1992, Actel Corporation, Sunnyvale, CA, pp. 1–35 through 1–44.

*The Programmable Logic Data Book*, 1994, Xilinx, Inc., San Jose, CA, pp. 2–7, 2–12, and 2–13.

"XC5000 Logic Cell Array Family, Technical Data, Advance Information," Xilinx, Inc., Feb. 1995.

INPUT/OUTPUT CIRCUITRY FOR PROGRAMMABLE LOGIC DEVICES

This application claims the benefit of U.S. provisional patent application No. 60/062,480, filed Oct. 16, 1997.

BACKGROUND OF THE INVENTION

This invention relates to programmable logic devices, and more particularly to circuitry for use in the input and/or output portions of programmable logic devices.

Illustrative programmable logic devices are shown in Cliff et al. U.S. Pat. No. 5,689,195, Huang et al. U.S. Pat. No. 5,764,080, Reddy et al. U.S. Pat. No. 5,977,793, and McClintock et al. U.S. patent application Ser. No. 08/920,298, filed Aug. 28, 1997, all of which are hereby incorporated by reference herein in their entireties.

As programmable logic devices become larger and therefore have more input/output ("I/O") pins, the complexity and flexibility with which the user may want to control the various pins tends to increase. The "control" thus referred to includes such functions as output enable, clock, clock enable, clear, etc. Because very large programmable logic devices have the capability of performing so many different functions, parallel control of all the I/O pins on the device may not always be compatible with the uses to which the core logic of the device can be put. On the other hand, full individual control of all aspects of the operations of all I/O pins on the device is probably wasteful of device resources, especially since many uses of the device will probably want parallel control of at least some functions of some I/O pins.

In view of the foregoing, it is an object of this invention to provide improved circuitry for controlling I/O pins on programmable logic devices.

It is a more particular object of this invention to provide I/O control circuitry for programmable logic devices which effects a good mix of both parallel and individual control of I/O pin functions and operation.

SUMMARY OF THE INVENTION

These and other objects of the invention are accomplished in accordance with the principles of the invention by providing programmable logic devices with I/O control signal buses that extend to large numbers of the I/O pins on the device but that are programmably segmentable into a plurality of segments, each of which extends to only an associated subset of the I/O pins. Each segment of an I/O control signal bus can be driven separately (e.g., by programmable logic on the device or by a special input pin). Thus each segment can provide a separate control signal to the I/O pins that it serves. Alternatively, two or more segments of a bus can be programmably connected to one another. Then the drive for only one of the connected segments is used and all the connected segments carry the same signal to all of the I/O pins served by those segments.

In addition to the foregoing, each I/O pin preferably includes circuitry for allowing individual selection of control signals from several sources, such as several adjacent I/O control signal buses of the type described above or logic circuitry near the I/O pin on the device.

Further features of the invention, its nature and various advantages will be more apparent from the accompanying drawings and the following detailed description of the preferred embodiments.

DETAILED DESCRIPTION OF THE PREFERRED EMBODIMENTS

Figure 1:
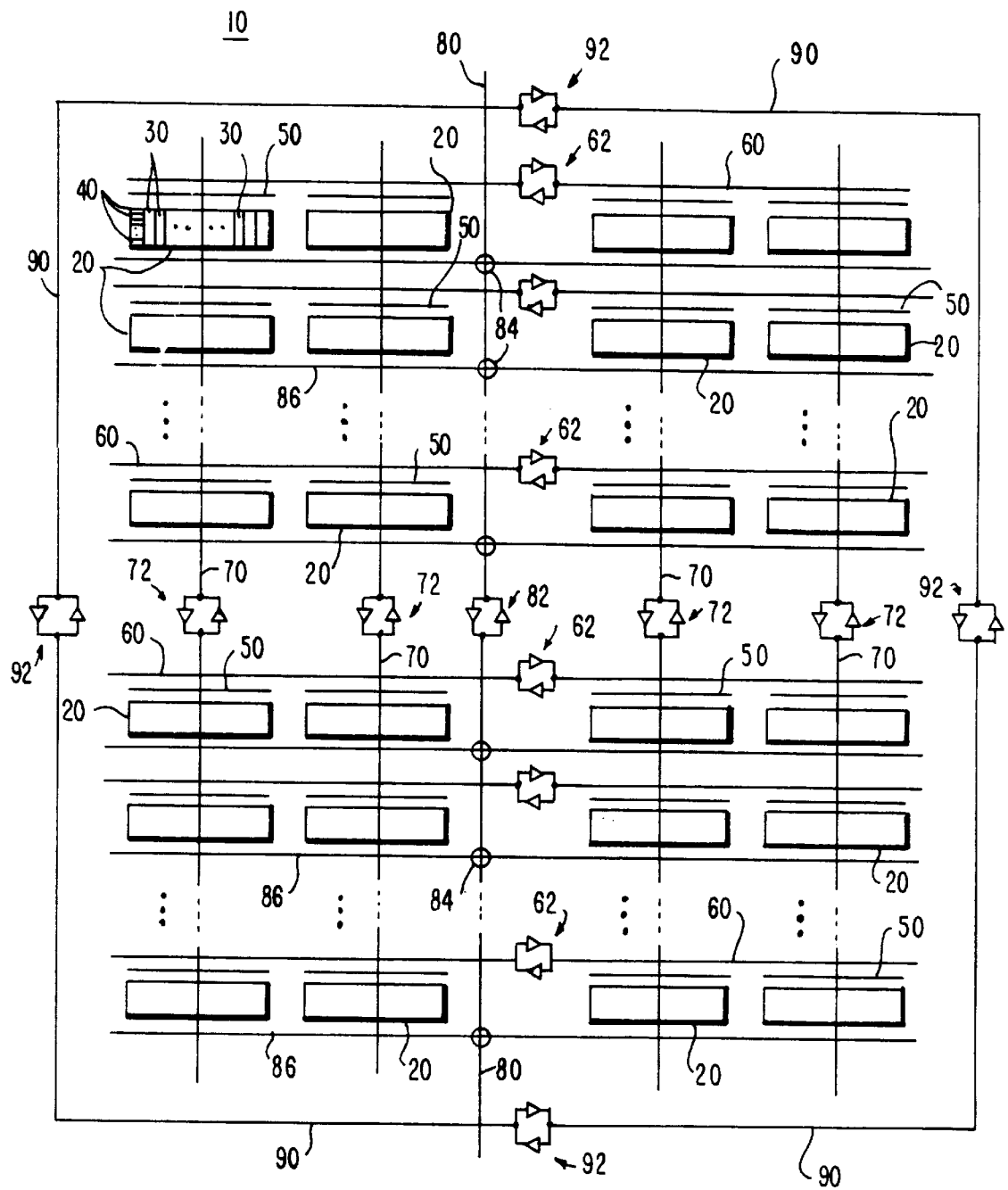
FIG. 1 is a simplified schematic block diagram showing portions of an illustrative embodiment of a programmable logic device in accordance with the invention.

As shown in FIG. 1, an illustrative programmable logic device 10 in accordance with the invention includes a plurality of super-regions 20 of programmable logic disposed on the device in a two-dimensional array of intersecting rows and columns of super-regions. For example, there may be four super-regions 20 in each row and 28 super-regions 20 in each column. Each super-region 20 includes a plurality of regions 30 of programmable logic in a one-dimensional array. (To avoid over-complicating FIG. 1, individual regions 30 are only shown in upper left-hand super-region 20.) For example, each super-region may include 16 regular and one special region 30. Each regular region 30 includes a plurality of subregions 40 of programmable logic in a one-dimensional array. (Again, to avoid over-complicating FIG. 1, individual sub-regions 40 are only shown in the upper left-hand region 30.) For example, each regular region 30 may include ten subregions 40. Each subregion 40 may basically comprise (1) a programmable four-input look-up table for producing an output signal which is any logical combination of four input signals applied to the look-up table, (2) a register for selectively registering the output signal of the look-up table, and (3) programmable logic connectors ("PLCs") for allowing final output signals of the subregion to be the unregistered and/or registered output of the look-up table. Each special region 30 may basically comprise a relatively large block of programmable memory that is usable as either read-only memory ("ROM") or random access memory ("RAM"). For example, each special region 30 may comprise a 2K (2048) bit memory.

Each super-region 20 has an associated plurality of intra-super-region interconnection conductors 50 for conveying signals to, from, and/or between the regions in that super-region. Although not shown in FIG. 1 (again to avoid over-crowding the drawing), each super-region 20 also includes pluralities of local conductors adjacent each of its regions 30 for conveying signals to, from, and/or between the subregions 40 in the regions.

Figure 8:
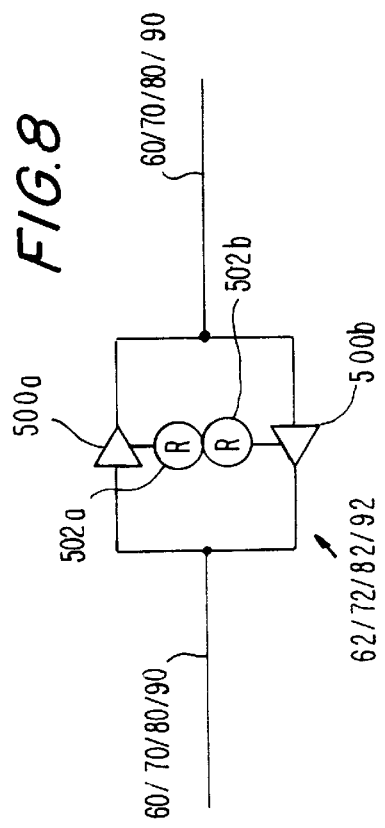
FIG. 8 is a more detailed, but still simplified, schematic block diagram of representative portions of the FIG. 1 device.

Each row of super-regions 20 has an associated plurality of horizontal inter-super-region interconnection conductors 60 extending along that row for conveying signals to, from, and/or between the super-regions in that row. Each conductor 60 is programmably segmentable into left and right halves by programmable segmentation buffers 62 so that each half can be used independently of the other half if desired. Alternatively, if the segments of a conductor 60 are to be used together, then either the upper driver in the associated segmentation buffer 62 can be programmably enabled to allow the left half of that conductor to drive the right half, or the lower driver in that buffer 62 can be programmably enabled to allow the right half to drive the left half. (An illustrative embodiment of a representative segmentation buffer is shown in more detail in FIG. 8. Upper tri-state driver 500a is selectively enabled by appropriately programming programmable function control element ("FCE") 502a (e.g., a RAM call on device 10). Lower tri-state driver 500b is selectively enabled by appropriately programming FCE 502b. As the reference designations like 62/72/82/92 in FIG. 8 indicate, the circuitry shown in that FIG. can be used not only for segmentation buffers 62, but also for other similar segmentation buffers 72, 82, and 92 that are described below.)

Each column of super-regions 20 has an associated plurality of vertical inter-super-region interconnection conductors 70 extending along that column for conveying signals to, from, and/or between the super-regions in that column. Each conductor 70 is programmably segmentable into upper and lower halves by programmable segmentation buffers 72 so that each half can be used independently of the other half if desired. Alternatively, if the segments of a conductor 70 are to be used together, then either the left-hand driver in the associated segmentation buffer 72 can be programmably enabled to allow the upper half of that conductor to drive the lower half, or the right-hand driver in that buffer 72 can be programmably enabled to allow the lower half to drive the upper half.

A plurality of so-called fast conductors 80 extends vertically across the approximate center of device 10. Some of conductors 80 may be driven by pins of the device. Other conductors 80 may be driven by super-regions 20 of the device (e.g., the super-regions 20 adjacent to each side of the center of the device and therefore closer to conductors 80). Each conductor 80 is programmably segmentable into upper and lower halves by programmable segmentation buffers 82 so that each half can be used independently of the other half if desired. Alternatively, if the segments of a conductor 80 are to be used together, then either the left-hand driver in the associated segmentation buffer 82 can be programmably enabled to allow the upper half of that conductor to drive the lower half, or the right-hand driver in that buffer 82 can be programmably enabled to allow the lower half to drive the upper half. In each row, conductors 80 are programmably connectable by PLCs 84 to horizontal fast conductors 86 which extend adjacent to all the super-regions in the row. Signals on the fast conductor network 80/82/84/86 can therefore reach any super-region/region/subregion on the device with relatively little delay (e.g., because there is relatively little switching in the fast conductor network). The fast conductor network is therefore configured for signal propagation speed efficiency.

A plurality of peripheral conductors 90 extends in a closed loop around the periphery of device 10. As will be discussed later in this specification, peripheral conductors 90 are an important source of control signals for the input/output pin circuitry of device 10. At the midpoint of each of the four sides of device 10 each conductor 90 is programmably segmentable by programmable segmentation buffers 92 so that each segment thus separated from other segments can be used independently of the other segments if desired. For example, if it is desired to use the lower right-hand quadrant of one of conductors 90 by itself, the segmentation buffers 92 at each end of that segment (i.e., at the midpoint of the bottom and at the midpoint of the right-hand side of device 10) can be programmably disabled, thereby isolating that conductor segment from the other three segments of that conductor (i.e., the upper right quadrant, the upper left quadrant, and the lower left quadrant segments). As another example, if it is desired to use the upper right quadrant segment and the lower right quadrant segment of a conductor 90 together but separately from the other segments of that conductor, one of the drivers of the segmentation buffer 92 associated with that conductor at the midpoint of the right-hand side of the device is programmably enabled, while the segmentation buffers 92 associated with that conductor at the top and bottom of the device are programmably disabled. If the left-hand driver in the buffer 92 at the midpoint of the right-hand side of the device is enabled, the lower right segment is driven from the upper right segment. On the other hand, if the other driver in the buffer 92 at the midpoint of the right-hand side of the device is enabled, the upper right segment is driven from the lower right segment. As still another example, any three segments of a conductor 90 can be connected together, while the fourth segment is isolated and therefore used separately. Or all four segments of a conductor 90 can be connected together as one substantially continuous conductor extending all the way around the periphery of device 10.

It will be apparent from the foregoing that circuitry like 62, 72, and 92 allows device 10 to be segmented into four quadrants (i.e., upper left, upper right, lower left, and lower right), each of which has its own core logic 20/30/40 and peripheral conductors 90, and each of which is operable without interference from the other segments. Similarly, two, three, or all four of these quadrants can be stitched together via elements 62, 72, and/or 92 to produce larger blocks of fully integrated logic if such larger blocks are needed.

Figure 2:
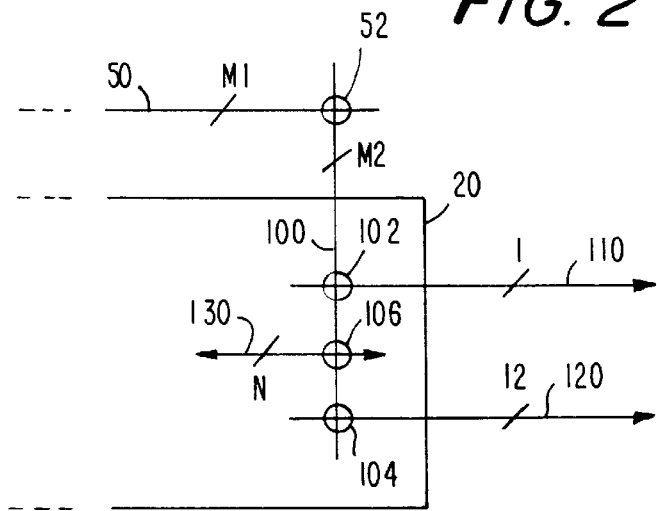
FIG. 2 is a more detailed, but still simplified, schematic block diagram of an illustrative embodiment of a representative portion of the FIG. 1 device.

FIG. 2 shows part of the circuitry associated with a super-region 20 which is at the right-hand end of a representative row in FIG. 1. The corresponding circuitry associated with a super-region 20 at the left-hand end of a row in FIG. 1 is a mirror image of FIG. 2. PLCs 52 allow conductors 50 to be programmably selectively connected to local conductors 100 at the end of super-region 20 (i.e., to the right of the right-most region 30 in that super-region). PLCs 106 allow conductors 100 to be programmably selectively connected to subregion input and output conductors 130 on the right-hand side of the right-hand-most region 30 in the super-region. For example, if each region 30 has ten subregions 40, and each subregion has two inputs and one output on its right-hand side, N in FIG. 2 may be 30 (for 20 inputs and ten outputs). (Although not shown in FIG. 2, each super-region 20 also has other groups of local conductors (like conductors 100) programmably connectable to conductors 50 and interleaved between each adjacent pair of regions 30 across the super-region. Other conductors (like conductors 130) extend left and right from each such group of local conductors 100 in order to supply inputs to and convey outputs from the regions to the left and right of each local conductor group.)

PLCs 102 allow conductors 100 to be programmably selectively connected to conductor 110. PLCs 104 allow conductors 100 to be programmably selectively connected to conductors 120. The next several FIGS. show how the signals on conductors 110 and 120 may be used.

Figure 3:
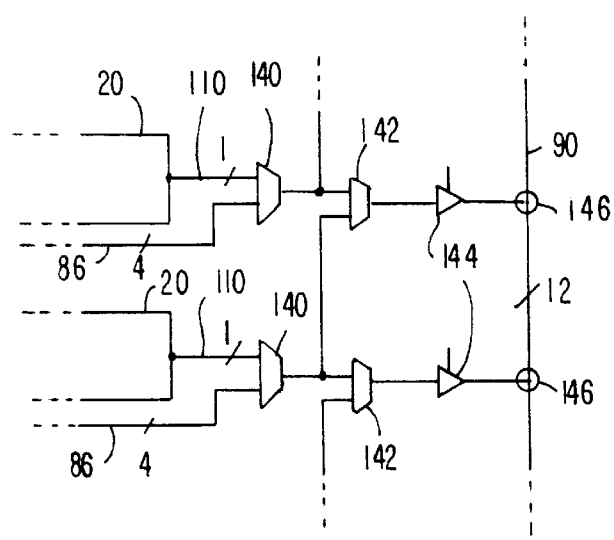
FIG. 3 is a more detailed, but still simplified, schematic block diagram of an illustrative embodiment of other representative portions of the FIG. 1 device.
Figure 4:
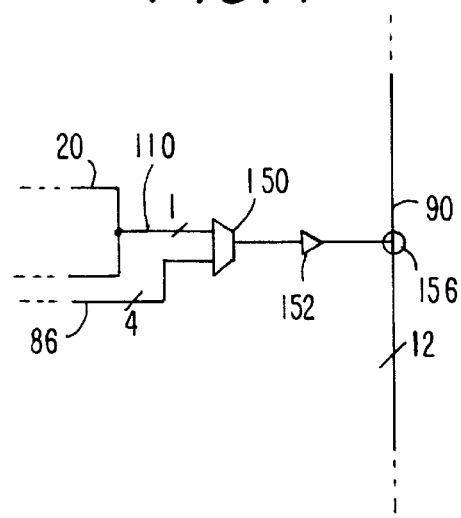
FIG. 4 is a more detailed, but still simplified, schematic block diagram of another illustrative embodiment of representative portions like those shown in FIG. 3.
Figure 5:
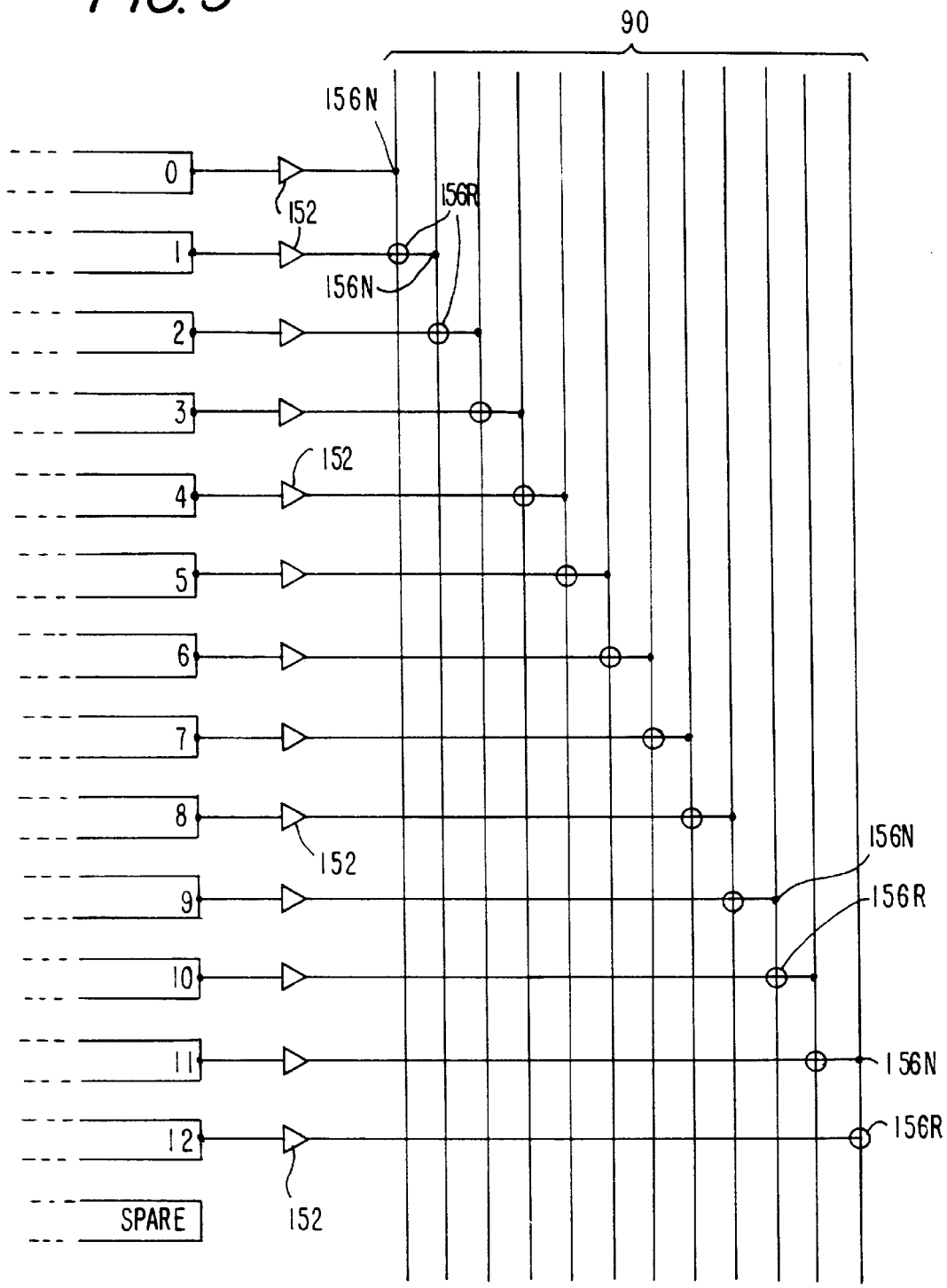
FIG. 5 is a simplified schematic block diagram of additional circuitry for the FIG. 4 embodiment.

FIG. 3 shows one illustrative embodiment of circuitry for utilizing the output signal 110 of each super-region 20. FIGS. 4 and 5 show another illustrative embodiment of such circuitry. In both cases the circuitry shown is on the right-hand side of device 10. Corresponding circuitry on the left is a mirror image.

Considering first the embodiment shown in FIG. 3, the output 110 of each super-region 20 is applied to one input terminal of PLC 140 (e.g., a multiplexer) associated with that super-region. The other inputs to each PLC 140 are the four fast conductors 86 that extend adjacent to the associated super-region 20. PLC 140 typically selects one of its inputs to be the source of its output signal. The output signal of each PLC 140 is applied to one input terminal of a PLC 142 associated with the super-region 20 to the left and to one input terminal of another similar PLC 142 associated with the super-region 20 above the super-region to the left. Each PLC 142 typically selects one of its two inputs to be the source of its output signal. PLCs 142 allow the outputs 110 of any of super-regions 20 to be shifted up by one row position so that an output 110 from below can take the place of an output 110 from a defective row. Thus, of the several rows of super-regions 20 in each upper and lower half of device 10, one row is a spare row and the other rows are regular rows. If one of the regular rows in either upper or lower half is defective, functions are shifted from that regular row to an adjacent row in the direction of the spare row, and from the adjacent row to the next adjacent row, and so on until all functions are implemented in good rows, including the spare row. Although FIG. 3 shows shifting signals up to compensate for a defective row, it will be readily apparent how the depicted connections between PLCs 140 and 142 can be modified to allow shifting signals down to compensate for a defective row.

The output signal of each PLC 142 is applied to the data input terminal of a tri-state driver 144 associated with the super-region 20 to the left. Each driver 144 is programmably selectively either enabled or tri-stated by an FCE (not shown) connected to its control input terminal. The output signal of each driver 144 is connected to a respective one of peripheral conductors 90 by a connection 146. In this embodiment each connection 146 may be a single, fixed connection. Preferably the number of rows of super-regions 20 in each upper and lower half of device 10 (not including spare rows) is at least equal to the number of peripheral conductors 90. Preferably also, each peripheral conductor 90 is driven once in each of the four quadrants of device 10 by circuitry of the type shown in FIG. 3. In other words, for each conductor 90 the lower-right segment of that conductor is driven from the right-hand end of a respective one of the rows of super-regions 20 in the lower half of the device, the lower left-hand segment is driven from the left-hand end of a respective one of the rows in the lower half of the device, the upper right-hand segment is driven from the right-hand end of a respective one of the rows in the upper half of the device, and the upper left-hand segment is driven from the left-hand end of a respective one of the rows in the upper half of the device. In this way each of the four quadrants of each conductor 90 can be driven separately in each quadrant if desired (assuming that the conductor 90 has been segmented by buffers 92 into four effectively separate conductors). Alternatively, if two or more segments of a conductor 90 have been stitched together by buffers 92, only one of the drivers 144 feeding those segments will typically be used, and the other unused drivers 144 will be tristated.

If the number of rows of super-regions 20 in each upper and lower half of device 10 exceeds the number of conductors 90, circuitry of the type shown in FIG. 3 does not have to be provided for those excess rows. Any spare rows that are provided are excess rows under normal conditions and therefore do not need to have their own elements 142, 144, and 146, even if such a spare row is provided with an element 140 to supply an input to the PLC 142 in the adjacent regular row.

In the alternative embodiment shown in FIGS. 4 and 5 PLC 150 is like PLC 140 and can therefore select as its output either the output 110 of the ssociated super-region 20 or the signal on one of the fast conductors 86 adjacent to that super-region. Driver 152 does not need to be a tri-state driver, and the output of each driver 152 is programmably connectable to either of two associated conductors 90 in a pattern like that shown in FIG. 5. In general, in the pattern shown in FIG. 5, each driver 152 has a programmable normal PLC connection 156N to one of conductors 90 and a programmable redundant PLC connection 156R to another conductor 90. Stated another way, each conductor 90 has a normal connection 156N to the driver 152 associated with a respective one of the rows of super-regions 20 and a redundant connection 156R to the driver 152 associated with an adjacent row. If all rows are operating normally, only normal connections 156N are used. If one row is defective, normal connections 156N are used for rows (if any) above the defective row, while redundant connections 156R are used for rows below the defective row. In this way the output 110 from a defective row can be replaced by the corresponding output from the row below, and the outputs 110 of other rows below the defective row are all similarly shifted up by one row.

In the embodiment shown in FIGS. 4 and 5 drivers 152 do not need to be tri-state drivers because if a driver output is not needed to drive a conductor 90, the connection 156N or 156R from that driver to that conductor is programmed "off".

As in the FIG. 3 embodiment, the circuitry of FIGS. 4 and 5 is repeated for each quadrant of device 10 (with appropriate left-to-right and/or top-to-bottom mirror imaging). Thus as in the FIG. 3 embodiment, each of the four segments of each conductor 90 is separately drivable from the associated quadrant of the device. Each segment of each conductor 90 can therefore be used separately, or various segments can be stitched together by buffers 92, with one of the stitched segments being driven from its associated quadrant of the logic and the other stitched segment(s) being driven from that segment.

Figure 6:
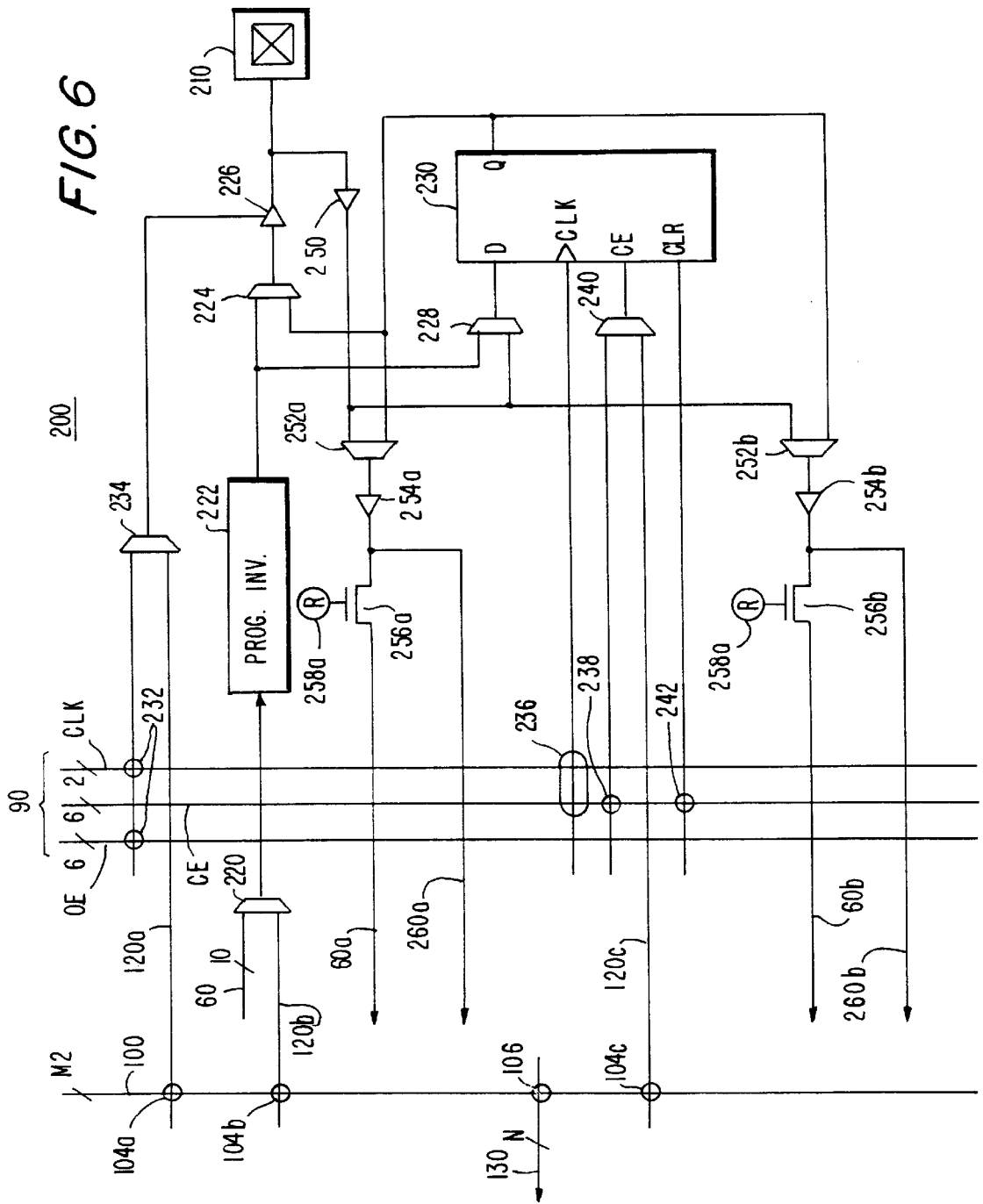
FIG. 6 is another more detailed, but still simplified, schematic block diagram of an illustrative embodiment of a representative portion of the FIG. 1 device.

FIG. 6 shows an illustrative embodiment of circuitry 200 associated with one representative I/O pin 210 adjacent the right-hand end of one representative row of super-regions 20. Some of the circuitry shown on the extreme left in FIG. 6 can be the same as the correspondingly numbered circuit elements in FIG. 2. In an illustrative preferred embodiment there are four or five I/O pins 210 at each end of each row of super-regions 20 (although other numbers of I/O pins can be associated with each row if desired). Thus the circuitry to the right of local conductors 100 in FIG. 6 will be repeated four or five times adjacent the right-hand end of each row and (in mirror image) four or five more times adjacent the left-hand end of each row. From the foregoing it will be understood that each group of four or five I/O pins 210 is served by one group of local conductors 100.

Preliminarily it should be noted that FIG. 6 shows that the 12 peripheral conductors 90 from previously described FIGS. 3–5 are divided into two groups of six output enable ("OE") and six clock enable ("CE") conductors 90. In addition, FIG. 6 shows the presence of two more clock ("CLK") conductors 90. The signals on the two CLK conductors 90 may be generated differently than has been illustrated in FIGS. 3–5 for the OE and CE conductors 90. For example, CLK conductors 90 may come from special clock input pins on device 10, and CLK conductors 90 may or may not be segmented (i.e., by buffers 92 as shown in FIG. 1) as desired.

Considering first the use of pin 210 as an output pin, the data to be output can come from any of conductors 100 (via PLCs 104b and conductor 120b) or from any one of ten of the horizontal interconnection conductors 60 associated with the row of super-regions 20 that pin 210 is associated with. PLC 220 makes this selection. If desired, the output signal from PLC 220 can be logically inverted by programmable inverter 222. The output signal of inverter 222 can be applied to pin 210 either in unregistered form (via PLC 224 and tri-state driver 226) or in registered form (via PLC 228, flip-flop register 230, PLC 224, and tri-state driver 226). (PLC 220 and the connections 60 shown in FIG. 6 are optional and can be omitted if desired.)

The control for tri-state driver 226 can come 20 from any one of conductors 100 (via PLCs 104a and conductor 120a) or from any one of the six OE or two CLK peripheral conductors 90 (via PLCs 232) adjacent to pin 210 and the associated end of a super-region row. PLC 234 helps to make this selection.

The clock signal for flip-flop register 230 can come from any one of the six CE or two CLK conductors 90 adjacent to pin 210 and the associated end of a super-region row. PLCs 236 make this selection.

A clock enable ("CE") input signal to register 230 can come from any one of conductors 100 (via PLCs 104c and conductor 120c) or from any one of the six CE conductors 90 (via PLCs 238) adjacent to pin 210 and the associated end of a super-region row. PLC 240 helps make this selection. The logical state of the CE input to register 230 can be used to determine whether or not the register responds to CLK signal pulses concurrently received by the register. This feature can be used to cause some registers 230 to effectively divide down the received CLK signal, to hold certain pins 210 while other pins change, etc.

A clear ("CLR") input signal to register 230 can come from any one of CE conductors 90 adjacent to pin 210 and the associated end of a super-region row. PLCs 242 make this selection.

The particular arrangements of PLCs 232, 236, 238, and 242 shown in FIG. 6 and described above are only illustrative, and other arrangements of those PLCs can be used instead if desired. Thus the outputs of any of PLCs 232, 236, 238, and 242 can come from any of conductors 90 as desired.

Considering now the use of pin 210 as an input pin, input driver 250 applies a data signal from pin 210 to one input terminal of each of PLCs 252a, 252b, and 228. PLC 228 can be used to select this input data signal for application to the data input terminal of register 230. Each of PLCs 252a and 252b can independently select either the unregistered input data signal (direct from driver 250) or the registered input data signal (from the Q output of register 230) for application to the associated drivers 254a and 254b. The output signal of each of drivers 254a and 254b can be applied to respective ones (60a and 60b) of the conductors 60 associated with the adjacent super-region row. This is done via pass gates 256a and 256b, which are respectively programmably controlled by FCEs 258a and 258b. In addition, the output signal of each driver 254a and 254b is applied to a respective one of conductors 260a and 260b, which lead (typically via other PLCs that are not shown) to drivers that drive onto various adjacent conductors 50, 60, and 70.

Figure 7:
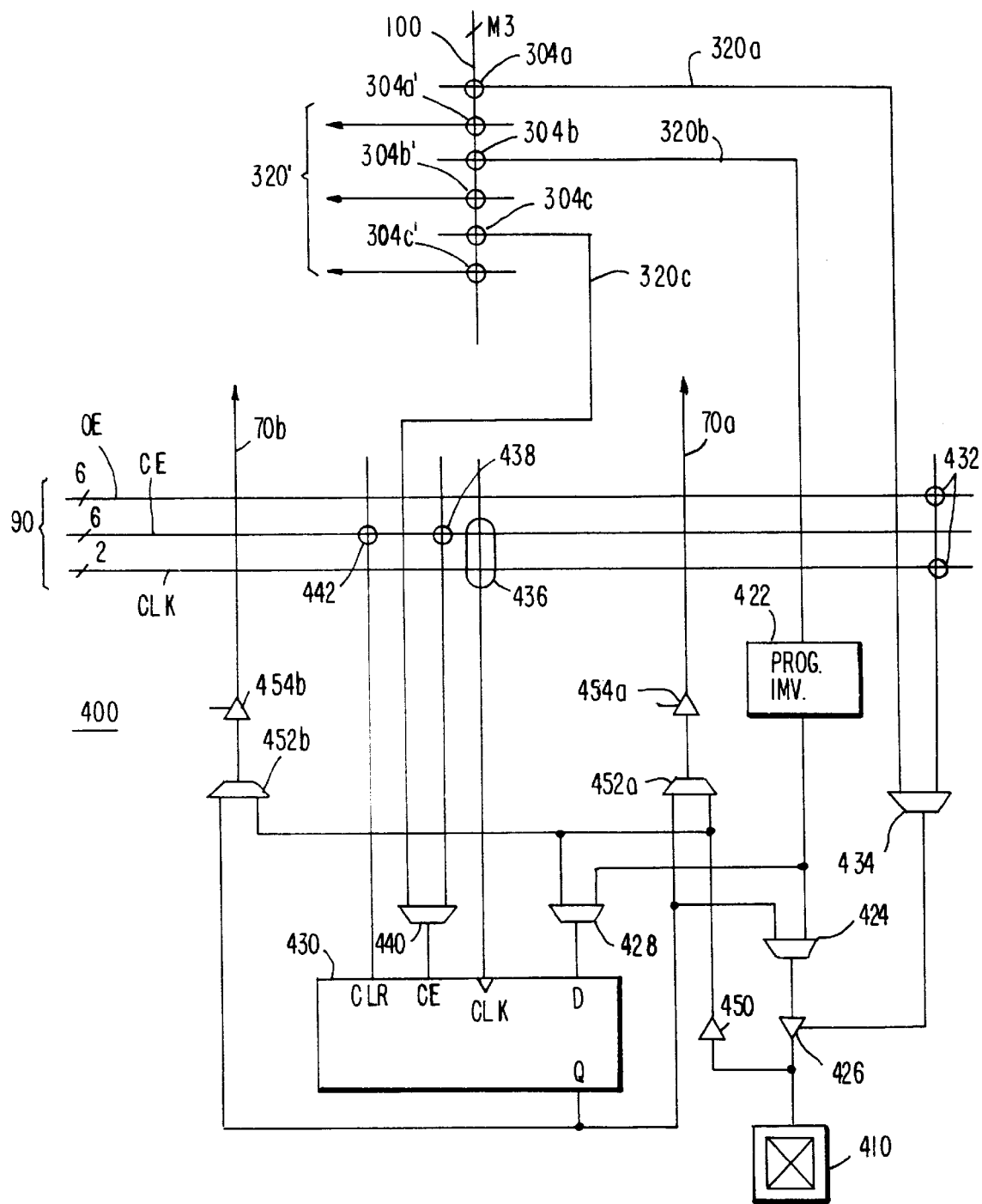
FIG. 7 is yet another more detailed, but still simplified, schematic block diagram of an illustrative embodiment of another representative portion of the FIG. 1 device.

FIG. 7 shows an illustrative embodiment of circuitry 400 associated with one representative I/O pin 410 adjacent the lower edge of device 10. In the illustrative embodiment being described there are two pins 410 adjacent each end of each column of regions 30. Each adjacent pair of pins 410 is served (in part) from the local conductors 100 between a respective adjacent pair of regions 30 in the super-region row immediately above bottom pins 410 or below top pins 410. Thus the I/O pin circuitry 400 shown in FIG. 7 is one of two similar circuits served by the depicted local conductors 100. In addition, at the top of the device directly opposite depicted conductors 100, similar conductors 100 in the top super-region row serve two more similar (but mirror image) circuits 400.

Except for being oriented differently on device 10, circuit 400 is very similar to the circuit 200 shown in FIG. 6. Elements with the same reference numbers in FIGS. 6 and 7 are the same (although a different group of conductors 100 is shown in FIG. 7 than is shown in FIG. 6, and the numbers of conductors ("M2" and "M3") may be different in these two different types of groups). Other elements that are similar to one another in FIGS. 6 and 7 have their reference numbers increased by 200 in going from FIG. 6 to FIG. 7. Thus it will generally not be necessary to specifically describe most of the elements in FIG. 7 because the description provided for the similar elements in FIG. 6 applies again. One difference that should be mentioned is that each of tri-state drivers 454a and 454b (controlled by programmable FCEs that are not shown) can be used to apply the associated PLC 452a or 452b output signal to conductors 70 associated with the adjacent column of regions 30. Another point that should be mentioned is that the elements 304a', 304b', 304c', and 320' correspond to the elements similarly identified without primes, but are used for the other circuit 400 served (in part) by the depicted conductors 100.

Although FIG. 7 shows programmable inverter 422 receiving a signal only from a conductor 320b, the circuitry could alternatively be constructed to allow element 422 to alternatively receive a signal from any of several adjacent conductors 70. For example, a PLC (like PLC 220 in FIG. 6) could be provided to select the signal applied to element 422 from either conductor 320b or any of 20 adjacent conductors 70. Also (as in the case of FIG. 6) the particular arrangements of PLCs 432, 436, 438, and 442 shown in FIG. 7 are only illustrative, and other arrangements of those PLCs can be used instead if desired. Thus, the outputs of any of PLCs 432, 436, 438, and 442 can come from any of conductors 90 as desired.

Although the foregoing discussion assumes that elements like 232, 236, 238, and 242 in FIG. 6 (and similar elements like 432, 436, 438, and 442 in FIG. 7) allow any of the conductors 90 that they partly enclose to be connected out by those elements, some of those elements may instead only allow some of the conductors 90 that they enclose to be connected out. For example, elements 242/442 may be provided for only two of CE conductors 90. As another example, elements 236/436 may be provided for only two CE and two CLK conductors 90.

Figure 9:
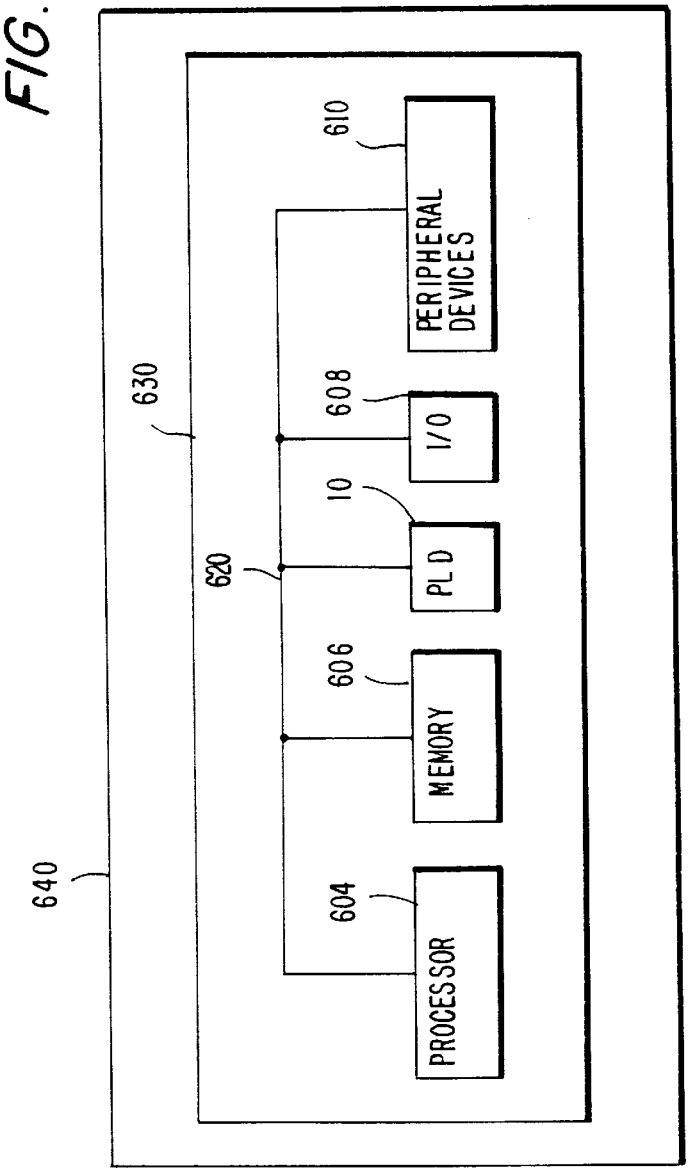
FIG. 9 is a simplified block diagram of an illustrative system employing a programmable logic device in accordance with the invention.

FIG. 9 illustrates a programmable logic device 10 in accordance with this invention in a data processing system 600. In addition to device 10, data processing system 600 may include one or more of the following components: a processor 604; memory 606; I/O circuitry 608; and peripheral devices 610. These components are coupled together by a system bus 620 and are populated on a printed circuit board 630 which is contained in an end-user system 640.

System 600 can be used in a wide variety of applications, such as computer networking, data networking, instrumentation, video processing, digital signal processing, or any other application where the advantage of using reprogrammable logic is desirable. Programmable logic device 10 can be used to perform a variety of different logic functions. For example, programmable logic device 10 can be configured as a processor or controller that works in cooperation with processor 604. Programmable logic device 10 may also be used as an arbiter for arbitrating access to a shared resource in system 600. In yet another example, programmable logic device 10 can be configured as an interface between processor 604 and one of the other components in system 600. It should be noted that system 600 is only exemplary, and that the true scope and spirit of the invention should be indicated by the following claims.

The PLCs mentioned throughout this specification (which includes the appended claims) can be implemented in any of a wide variety of ways. For example, each PLC can be a relatively simple programmable connector such as a switch or a plurality of switches for connecting any one of several inputs to an output. Alternatively, each PLC can be a somewhat more complex element which is capable of performing logic (e.g., by logically combining several of its inputs) as well as making a connection. In the latter case, for example, each PLC can be product term logic, implementing functions such as AND, NAND, OR, or NOR. Examples of components suitable for implementing PLCs are EPROMs, EEPROMs, pass transistors, transmission gates, antifuses, laser fuses, metal optional links, etc. As has been mentioned, the components of PLCs can be controlled by various, programmable, function control elements ("FCEs"), which are not always shown separately in the accompanying drawings. (With certain PLC implementations (e.g., fuses and metal optional links) separate FCE devices are not required, so that in those cases any depiction of FCE devices in the accompanying drawings merely indicates that the PLCs are programmable.) FCEs can also be implemented in any of several different ways. For example, FCEs can be SRAMs, DRAMs, first-in first-out ("FIFO") memories, EPROMs, EEPROMs, function control registers (e.g., as in Wahlstrom U.S. Pat. No. 3,473,160), ferro-electric memories, fuses, antifuses, or the like. From the various examples mentioned above it will be seen that this invention is applicable both to one-time-only programmable and reprogrammable devices.

It will be understood that the foregoing is only illustrative of the principles of this invention, and that various modifications can be made by those skilled in the art without departing from the scope and spirit of the invention. For example, the number of each type of conductor or other circuit component or logic structure that is mentioned herein is only exemplary. These numbers may be increased or decreased as desired. As just a few specific illustrations of this, the number of subregions 40 in each region 30 can be different from the number mentioned above, the number of regions 30 in each super-region 20 can be different from the number mentioned above, the number of super-regions in each row and/or column can be different, the number of rows and/or columns can be different, etc. For some aspects of the invention, the organization of the core logic of the device can be different from the subregion/region/super-region organization shown and described herein. Terms like "row" and "column", "horizontal" and "vertical", "left" and "right", "upper" and "lower", etc., are used only for convenience herein, and no absolute or fixed orientations or directions are intended thereby. Many other such modifications within the scope of the invention will occur to those skilled in the art.

The invention claimed is:

1. A programmable logic device comprising:

a plurality of terminal pins disposed around the periphery of the device and configured to convey data signals to or from the device;

terminal pin control circuitry associated with each of the terminal pins and configured to control passage of data signals via the associated terminal pin in response to control signals applied to the terminal pin control circuitry;

a plurality of conductors extending around the periphery of the device and configured to convey the control signals to the terminal pin control circuitry adjacent to the conductors, each of the conductors being subdivided into a plurality of segments, each of which is associated with an adjacent portion of the periphery of the device and can be used to supply the control signals to the terminal pin control circuitry for the terminal pins in the associated portion of the periphery; and segmentation circuitry configured to programmably selectively connect plural segments of each conductor to one another.

2. The device defined in claim 1 further comprising:

control signal source circuitry associated with each of the segments of each conductor and configured to selectively apply a control signal to the associated segment which can be different from the control signals applied to other segments of that conductor.

3. The device defined in claim 2 wherein the control signal source circuitry associated with at least some of the segments comprises:

logic circuitry of the device.

4. The device defined in claim 1 wherein the segmentation circuitry is operatively disposed between first and second segments of one of the conductors and comprises:

a first buffer circuit configured to programmably selectively allow the first segment to drive the second segment; and a second buffer circuit configured to programmably selectively allow the second segment to drive the first segment.

5. The device defined in claim 1 wherein each of the segments of each of the conductors extends along approximately a respective one quarter of the periphery of the device.

6. The device defined in claim 5 wherein each of the quarters of the periphery of the device includes adjacent halves of two adjacent sides of the device.

7. The device defined in claim 6 further comprising:

programmable logic connector circuitry associated with each of the segments of each conductor and configured to programmably selectively connect a portion of logic circuitry of the device which is adjacent to the segment associated with that programmable logic connector circuitry so that that portion of the logic circuitry can be used as a source for the control signal on that segment.

8. The device defined in claim 2 further comprising:

a network of second conductors configured for speed efficiency and extending adjacent to each of the segments of each conductor, and wherein the control signal source circuitry associated with each of the segments of each conductor is configured to derive the control signal from the network adjacent to that segment.

9. The device defined in claim 1 wherein the control signals include an output enable signal.

10. The device defined in claim 1 wherein the control signals include a clock enable signal.

11. The device defined in claim 1 wherein the control signals include a clock signal.

12. A digital processing system comprising:

processing circuitry;

a memory coupled to said processing circuitry; and a programmable logic device as defined in claim 1 and coupled to the processing circuitry and the memory.

13. A printed circuit board on which is mounted a programmable logic device as defined in claim 1.

14. The printed circuit board defined in claim 13 further comprising:

a memory mounted on the printed circuit board and coupled to the programmable logic device.

15. The printed circuit board defined in claim 13 further comprising:

processing circuitry mounted on the printed circuit board and coupled to the programmable logic device.

* * * * *